United States Patent [19]
Wilstrup et al.

[11] Patent Number: 5,773,990
[45] Date of Patent: Jun. 30, 1998

[54] INTEGRATED CIRCUIT TEST POWER SUPPLY

[75] Inventors: Jan B. Wilstrup, Mounds View; Stanley Peter Mros, Roseville, both of Minn.

[73] Assignee: Megatest Corporation, San Jose, Calif.

[21] Appl. No.: 536,206

[22] Filed: Sep. 29, 1995

[51] Int. Cl.[6] .................................................. G01R 15/12
[52] U.S. Cl. .......................................... 324/765; 324/763
[58] Field of Search ............................... 324/73.1, 158.1, 324/765, 763; 323/285; 371/21.1, 21.4, 22.1, 22.3, 22.6, 15.1; 438/14, 18; 257/40, 48; 330/279, 282

[56] References Cited

U.S. PATENT DOCUMENTS

| | | | |
|---|---|---|---|
| 3,617,881 | 11/1971 | McCormick | 330/69 |
| 5,059,889 | 10/1991 | Heaton | 323/285 |
| 5,481,551 | 1/1996 | Nakano et al. | 324/765 |
| 5,514,976 | 5/1996 | Ohmura | 324/765 |

*Primary Examiner*—Vinh P. Nguyen
*Attorney, Agent, or Firm*—Flehr Hohbach Test Albritton & Herbert LLP

[57] ABSTRACT

A power supply for testing an integrated circuit includes a source voltage input terminal for receiving an input voltage. The power supply serves as both a DUT active power supply and an IDDQ measurement circuit, without the need for switching between separate DUT active power supply and IDDQ measurement circuits. In one embodiment, a current source output driver includes a diode across a current sensing resistor inside a feedback loop. This minimizes VDD changes when the DUT demands transient current, such as when loading IDDQ test vectors. Moreover, with decreased transient changes in VDD, dielectric absorption effects of a decoupling capacitor are reduced.

8 Claims, 13 Drawing Sheets

INTEGRATED CIRCUIT TEST POWER SUPPLY

FIELD

The present invention pertains to electronic testing, and more specifically to testing the operational current (IDD) and quiescent current (IDDQ) of a CMOS integrated circuit.

BACKGROUND

A significant number of integrated circuits are fabricated utilizing CMOS circuitry due to the low power consumption of CMOS devices, particularly in the quiescent (nonswitching) state. Testing a CMOS device quiescent power supply current (IDDQ) is a useful technique because excessively high IDDQ current may indicate a defect in the circuit that may result in premature failure of the circuit. An excessive IDDQ current might be caused by, for example, gate oxide leakage within the device indicating a poorly fabricated integrated circuit. Moreover, it has been determined that CMOS devices having high IDDQ may, although functional at the time of test, be unreliable and thus exhibit a shorter than desirable operating lifetime.

Integrated circuits, including CMOS integrated circuits, are typically extensively tested prior to shipment to a customer and installation in a multi-component electronic system. Given the large size of CMOS integrated circuits, the testing is extensive and is performed by sophisticated electronic test systems, such as the Mega 1 tester available from MegaTest Corporation of San Jose, Calif., the assignee of this invention.

Figure 1:
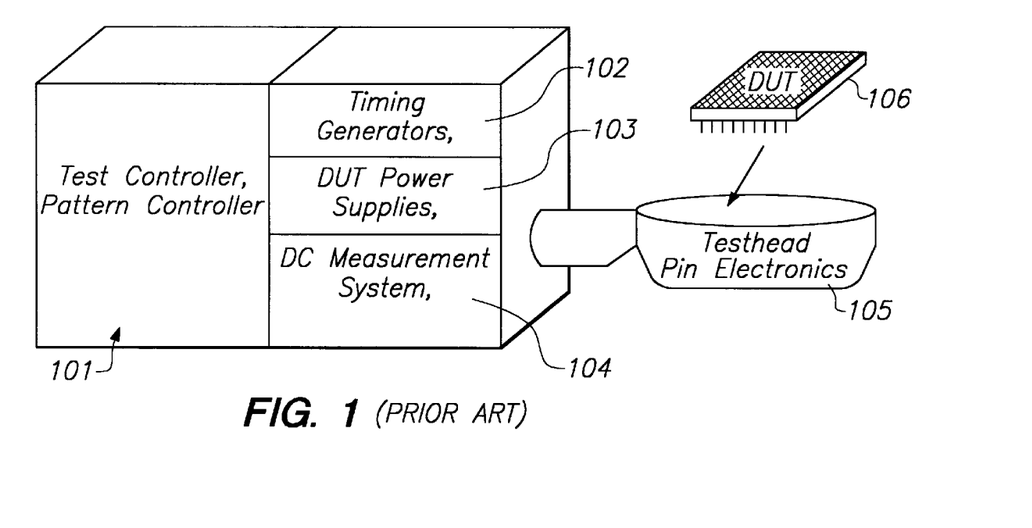
FIG. 1 depicts a general semiconductor test system according to the prior art.

A typical semiconductor test system depicted in FIG. 1 includes a test controller 101 which provides digital signals to control the operation of timing generators 102, a device under test (DUT) power supply 103, and DC measurement system 104 of the semiconductor test system. Subsections 102, 103, 104 are connected to test head pin electronics 105 which transmits highly accurate test signals to DUT 106 and monitors the pins of DUT 106 in order to measure voltages, currents and logic levels. In this manner, DUT 106 is tested for proper functionality under a wide range of operating conditions. The DUT power supply 103 of the semiconductor test system is programmable to provide desired voltage and current levels. The DC measurement system 104 is also programmable to provide appropriate current and voltage measurement ranges. One difficulty in such prior art test systems is that current measurement ranges vary considerably between high current ranges used to measure operational current IDD, such as output buffer current capacities, and the extremely low current ranges used to measure quiescent current IDDQ.

Figure 2:
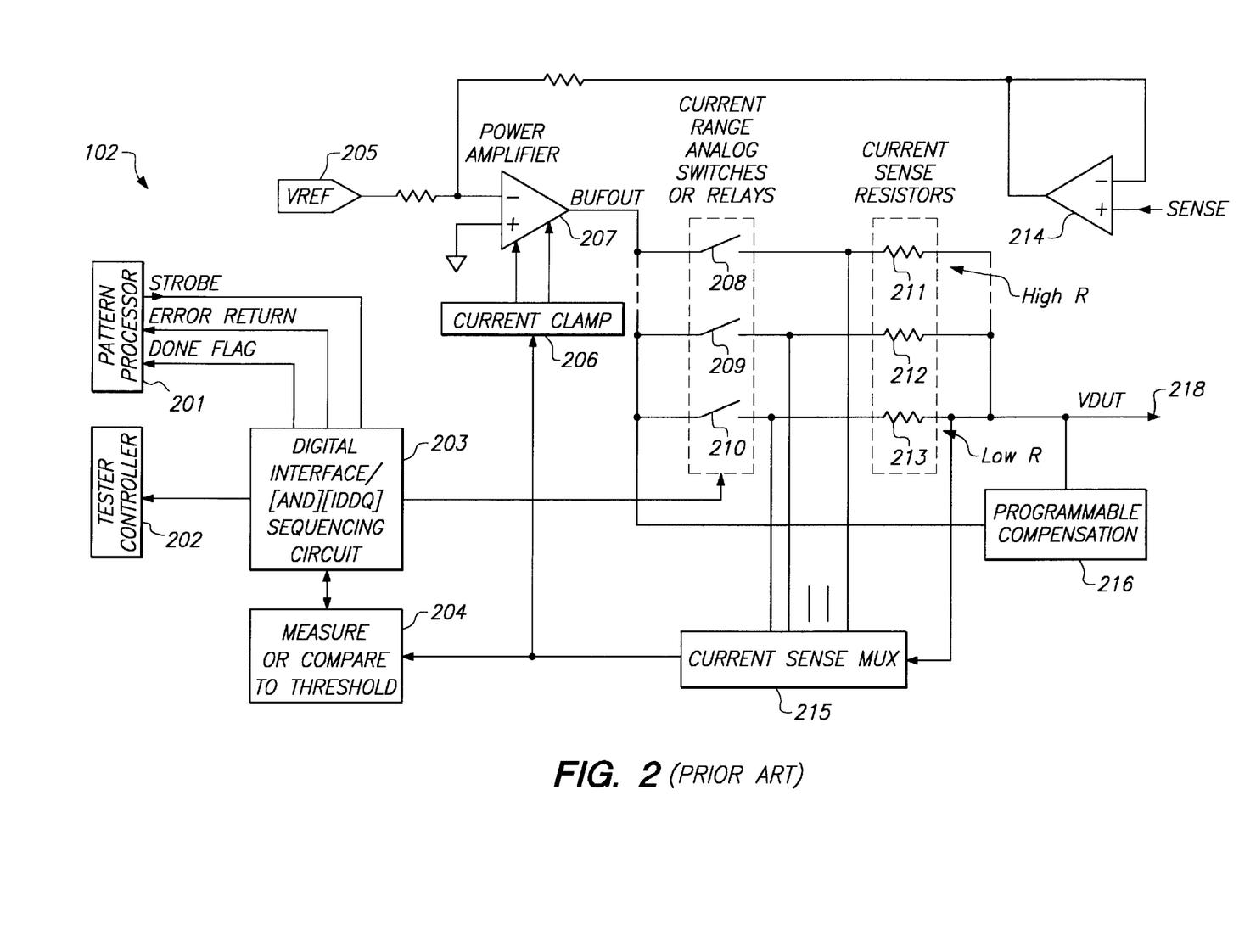
FIG. 2 depicts a test system power supply according to the prior art.

FIG. 2 is a block diagram depicting a typical prior art power supply 103 useful in measuring both high and low current ranges, thereby suitable for use in measuring both IDD and IDDQ of a CMOS integrated circuit. As shown in FIG. 2, busses 201, 202 are used to communicate between the test controller/pattern processor 101 and digital interface/sequencing circuit 203. A voltage reference VREF is received on input terminal 200 and applied to main control amplifier 205. A compensation circuit 205a is coupled between the VREF and amplifier 205 to provide a response that reduces overshoot and ringing. Power amplifier 207 receives the signal from amplifier 205 and provides a buffered reference voltage output BUFOUT. This buffered output voltage is applied to a parallel array of current range analog switches 208, 209, 210, which are each coupled to current sense resistors 211, 212, and 213, respectively. The resistors are then coupled to VDUT output terminal 218 which provides a desired voltage to the DUT. VDUT terminal 218 is also coupled to current sense multiplexer 215 which serves to monitor the voltage across, and thus the current through, current sense resistors 211, 212, and 213. A current sense signal is output from current sense multiplexer 215 and applied to comparison circuitry 204 to compare the current sense signal against a predetermined threshold. Comparison circuit 204 communicates with digital interface/sequencing circuit 203 in order to validate the current levels as acceptable, or to set an error flag when the current level is beyond the threshold. Current clamp 206 serves to control power amplifier 207 in response to the current sense output of current sense multiplexer 215 in order to prevent damaging the integrated circuit and prevent overload of current sensor 215.

Buffer 214 receives a sense signal from the DUT pin connected to VDUT lead 218 in order to compensate for resistance caused voltage drops on lead 218.

Figure 3:
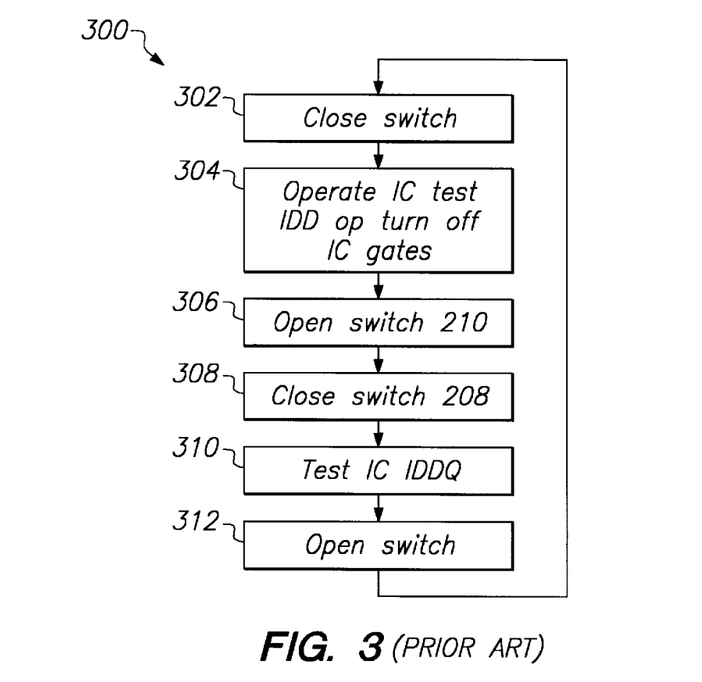
FIG. 3 is a flow chart showing steps performed by the power supply of FIG. 2.

During the operation of prior art circuit of FIG. 2, the integrated circuit is tested according to the flow chart of FIG. 3. In step 302, the power supply 103 is programmed to a high current range by closing switch 210, which is associated with a low value resistor 213. Then, in step 304, a test pattern is executed to bring the DUT to a known state. A high current range resistor (low impedance value) is used during this period since the DUT is being exercised causing the internal transistors to turn on and off and thus utilize an operational supply current IDD. Ordinarily, various performance parameters of the device under test are measured during testing.

Once a desired state has been reached, the pattern is stopped, causing the device under test to cease switching its internal transistors. In step 306, switch 210 is opened. A transient is created at the VDUT terminal when the switch 210 is opened due to charge injection caused by the semiconductor switch. Step 308 then closes switch 208 creating another transient accumulated charge, and the device under test power supply 102 is set to a low range, the IDDQ current range. After the IDD current settles, in step 310, the quiescent current IDDQ is measured across resistor 211 by current sense multiplexer 215. If, as determined by comparison circuit 204, the measured IDDQ current is beyond the threshold, an indication signal is sent to digital interface 203 and appropriate action taken, for example by notifying the test engineer, or indicating that the part failed the IDDQ test.

Next, in step 312, the DUT power supply 102 opens switch 208 and returns the procedure to step 302 where the power supply 103 is programmed back to a high current state by closing switch 210. The voltage compensation loop including amplifier 214 and amplifier 207, reacts to the changing current requirement by supplying additional current. This switching causes another transient in the VDUT signal because of the change injection caused by the semiconductor switch. Once the VDUT signal settles, testing is repeated with a different pattern established by the test controller 101 to test IDDQ based on different internal states so that a wide variety of defects can be detected.

As discussed briefly above, switching among the various sensing resistors causes transients to appear at the VDUT terminal. The prior art DUT power supply design (FIG. 2) which has IDDQ measurement capability causes transients in VDUT when a high impedance sense resistor 211 is switched out and a low impedance sense resistor 213 is switched in, and node voltages BUFOUT and VDUT are different. The difference between these voltages, before the switch is made, is equal to the IDDQ current times the IDDQ current sense resistor 211. When switch 208 is opened and switch 210 is closed, the current into VDUT terminal 218 becomes the difference between nodes BUFOUT and VDUT divided by the high current sense resistor 213. Since current sense resistor 213 is a much lower impedance than current sense resistor 211 and since BUFOUT is greater than VDUT at the switch time, the resulting current-is large. This high current will continue until main control amplifier 205 and power amplifier 207 corrects BUFOUT to the appropriate level to maintain the VDUT voltage at the programmed level. Because a time delay is associated with the feedback loop to control the power amplifier, the surge of current will cause a voltage variation at VDUT terminal 218. Moreover, because of the compensation requirements, a relatively large decoupling capacitor 219 (e.g. 10 $\mu$F or more) is required to maintain a steady voltage at VDUT terminal 218.

Figure 4:
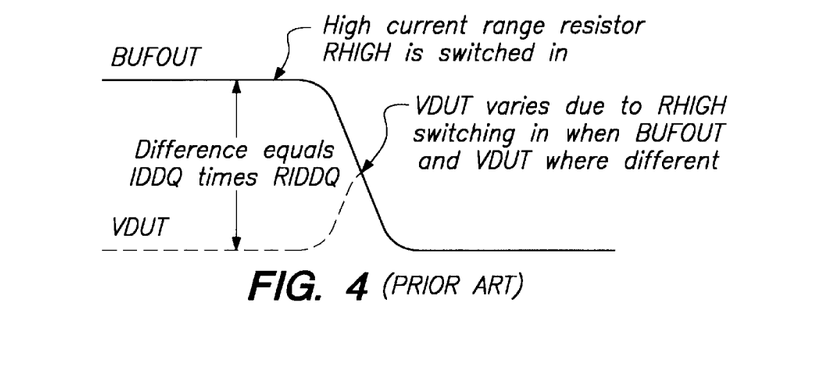
FIG. 4 is a graph showing the output current of the power supply of FIG. 2 with respect to time.

FIG. 4 shows a timing diagram depicting the operation of the prior art circuit of FIG. 2. When a transition is made during step 306 when switch 210 is opened, a transient is created at the VDUT terminal due to the accumulation of charge. Moreover, when a transition is made during steps 312 to 302, a transient is created at the VDUT terminal due to the mismatch in driving impedance.

The difference between the BUFOUT and VDUT voltage levels within the power supply 103 is the voltage appearing across the selected current sense resistor, with IDDQ being defined by $$IDDQ=(BUFOUT-VDUT)/RIDDQ,$$

where RIDDQ is the resistance value of the selection current sense resistor. When the transition is made from step 312 to step 302, a lower value resistor 213 is placed in series with the CMOS integrated circuit. This lower value resistor 213 allows the VDUT voltage to increase because the power amplifier 207 (BUFOUT) had previously been driving a large value resistor 211, and consequently there was previously a large difference between the voltages BUFOUT and VDUT.

Moreover, as shown in FIG. 3, if current range switching is performed with solid state switches, a charge is injected into the system, causing a transient increase in the voltage level of VDUT. As a result, test time must be increased in order to allow this transient effect on VDUT to be discharged before a measurement is made. Increased test times increase the cost of test since fewer devices can be tested in a given amount of time on a given tester. While relays can be used rather than solid state switches as switches 208 through 210, charge injection will be much smaller but switching times will be much longer, also resulting in long test times. However, the life expectancy and reliability of relays is significantly less than that of solid state switches. Furthermore, under some conditions, noise will be injected into the DUT supply voltage when switching from an IDDQ measurement range to a higher current range. This noise makes the IDDQ test less reliable or requires a significant additional time for the IDDQ test since measurements cannot be made until the noise transients have dissipated.

SUMMARY

The present invention pertains to electronic testing, and more specifically to testing the operational current (IDD) and quiescent current (IDDQ) of a CMOS integrated circuit.

In accordance with the teachings of this invention, a novel method and structure are taught for switching a measurement current range of a device under test (DUT) power supply while conditioning the DUT supply voltage and reducing settling time and measurement time.

One embodiment of a power supply for testing an integrated circuit includes a source voltage input terminal for receiving an input voltage. The power supply serves as both a DUT active power supply and an IDDQ measurement circuit, without the need for externally switching between separate DUT active power supply and IDDQ measurement circuits. In one embodiment, a current source output driver includes a diode across a current sensing resistor inside a feedback loop. This minimizes VDD changes when the DUT demands transient current, such as when loading IDDQ test vectors. Moreover, with decreased transient changes in VDD, dielectric absorption effects of a decoupling capacitor are reduced.

The test controller procedures are simplified since the shunt resistor need not be switched from a low value to a high value when changing from the loading IDDQ test vector operation to the measurement of IDDQ. Moreover, no current measurement range changes are needed, since the power supply circuit automatically responds to DUT peak current demands without the need for computer control. Furthermore, the compensation network need not change when switching between the loading IDDQ test vector operation to the IDDQ measurement, since the loop response does not change when the DUT changes from large current demands to small current demands.

Advantages of the invention include improved compensation of the transfer function, improved output voltage control and reduced settling time, by reducing voltage spikes on the output. These advantages further provide more efficient testing of integrated circuits by reducing the time necessary to properly test the circuits and improving the accuracy of the resulting test.

BRIEF DESCRIPTION OF THE DRAWINGS

Additional advantages of the invention will become apparent upon reading the following detailed description and upon reference to the drawings, in which.

DETAILED DESCRIPTION

The present invention pertains to electronic testing, and more specifically to testing the operational current (IDD) and quiescent current (IDDQ) of a CMOS integrated circuit.

Exemplary embodiments are described herein with reference to specific configurations. Those skilled in the art will appreciate that various changes and modifications can be made to the exemplary embodiments while remaining within the scope of the present invention.

Figure 5:
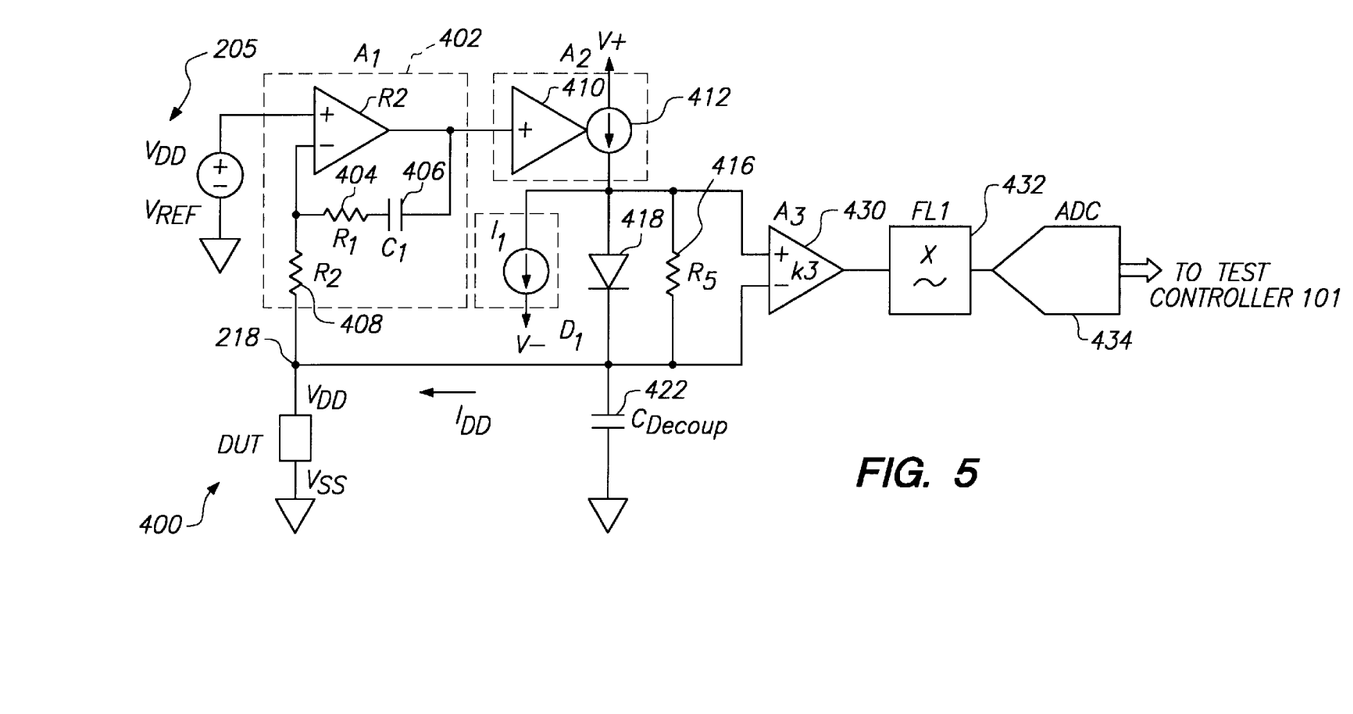
FIG. 5 depicts an embodiment of a power supply according to the invention.

One embodiment of a power supply 400 according to the invention is depicted in FIG. 5. Elements similar to those described with respect to the prior art power supply 103 of FIG. 2 are commonly numbered.

Power supply 400 serves as both a DUT active power supply and an IDDQ measurement circuit. A VDD reference voltage (VDDREF) is applied to input terminal 205 and to the non-inverting input of amplifier 402 in order to set the DUT supply voltage at a desired level. VDDREF is provided by any convenient manner, such as a digital to analog converter driven by test controller 101. Amplifiers 402 and 410 form a second order control loop which is compensated by resistor 404 and capacitor 406. The values of resistor 404 and capacitor 406 are set to establish the loop settle time and are related to the value of decoupling capacitor 422. Decoupling capacitor 422, which is preferably located near the DUT, keeps the DUT VDD voltage level stable when the DUT current demands change rapidly. The value of decoupling capacitor 422 is preferably selected in accordance with the current requirements of the DUT, with devices which demand large amounts of current preferably being tested utilizing larger values of decoupling capacitor 422 in order to provide a stable VDD voltage level.

When the DUT switches, it demands a large current (often on the order of 1 amp or more) from the DUT power supply. During this power demand period, the control loop formed by amplifiers 402, 410 and related components responds to this current demand by providing an increased IDD current, causing diode 418 to conduct which in turn causes current to flow into decoupling capacitor 422 and the DUT. This insures that the voltage level VDD remains relatively stable during the transient switching period. When the DUT is finished switching, IDD decreases to IDDQ, the quiescent value of IDD (often on the order of approximately 1 $\mu$A). In quiescent mode, diode 418 turns off and the low value of IDDQ flows entirely through shunt resistor 416 ($R_5$). At this time, amplifier 430 amplifies the voltage across shunt resistor 416 and provides an output voltage indicative of IDDQ according to the formula:

$$V_{out} = K_3 IDDQ\, R_s$$

where $K_3$ is the gain of amplifier 430, $R_s$ is the resistance value of shunt resistor 416, and IDDQ is the quiescent current consumed by the DUT.

Diode 419 is disposed in parallel with diode 418 in the opposite direction. Diode 419 provides a sink for high current from the decoupling capacitor 422. Diode 419 allows the power supply 400 to be quickly placed into a safe mode so that the DUT can be safely removed from the test terminal 218.

A precision measurement function is another aspect of the invention. This is performed by programming VREF 205 to supply a predetermined voltage and measuring the current at the VDUT terminal 218. In this operation, diodes 418 and 419 promote fast settling times of the VDUT voltage by quickly passing current across Rs416 until the VDUT voltage settles. Moreover, diodes 418 and 419 prevent the output stage from saturating.

The output voltage of amplifier 430 ($V_{out}$) is filtered by filter 432 and applied as an input voltage to analog to digital converter 434 which derives a digital value corresponding to $V_{out}$. This value is sent to test controller 101 so that the actual level of IDDQ can be calculated and compared to an acceptable threshold.

Filter 432 is, in one embodiment, a low pass filter that removes high frequency noise on signal $V_{out}$. As the cutoff frequency of filter 432 is decreased, less noise is passed to analog to digital converter 434, providing a more accurate IDDQ reading. However, with a lower cutoff frequency, the speed of the IDDQ measurement will be slower as well.

The main source of noise in power supply 400 is amplifier 402, and thus amplifier 402 is preferably selected to have a very low input voltage noise, in order to improve accuracy and speed measurement time.

Figure 6:
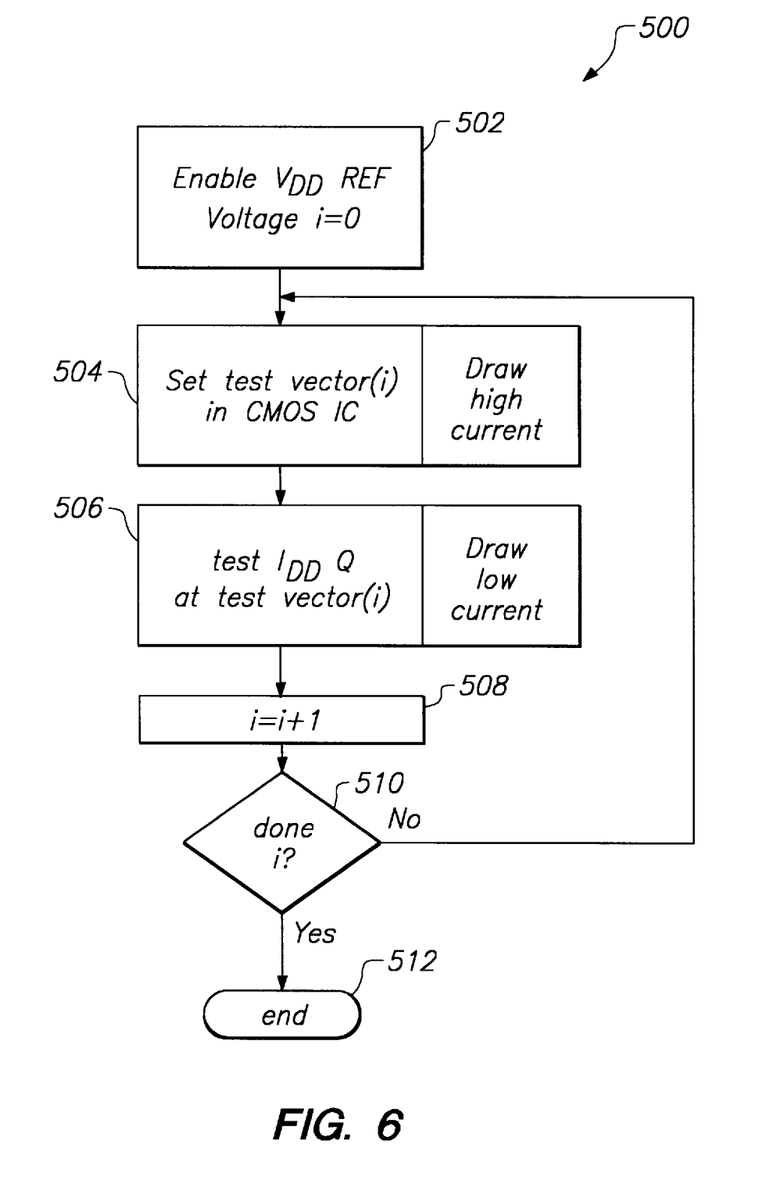
FIG. 6 is a flow chart showing steps performed by the power supply of FIG. 5.

FIG. 6 is a flow chart showing steps performed by an IC test apparatus using the power supply of FIG. 5. In Step 502, a reference voltage VDD REF is supplied to input terminal 205, and a test vector count (i) is set to 0. Step 504 begins an iterative method that checks test vectors supplied by test controller 101. Step 504 sets a test vector according to a count (i). During step 504, power supply 400 must supply operational current to DUT to permit DUT to switch according to the necessary test vectors. Step 506 tests the IDDQ of the IC by sensing the current across the shunt resistor 416. During step 506, power supply 400 supplies quiescent current to DUT. In step 508 the count (i) is incremented. Step 510 checks the count (i) to determine if all the test vectors are complete, and if not, the operation is returned to step 504 which sets the next test vector. When all the test vectors are complete, step 510 sends the operation to step 512 to end the test. Thereafter, another IC will be tested according to the flowchart. Moreover, test controller 101 will determine, based on the test, whether each tested IC successfully passed the test.

In accordance with this invention, power supply 400 provides significant advantages as compared to the prior art. First, power supply 400 responds automatically to DUT operational IDD demands, with diode 418 conducting when IDD is large, and diode 418 not conducting as IDD decreases to IDDQ. No processor intervention or switching is required to accomplish this transition. Also, the output of amplifier 410 is a current source 412, meaning that the dynamic response of the control loop does not change when diode 418 switches on or off. This simplifies loop compensation over the IDD operating range which allows a fast loop response without sacrificing loop stability. As a consequence, in this embodiment, VDD is more highly regulated than in the prior art[, since the power supply is driven by a current rather than voltage, allowing automatic voltage compensation in both the IDDQ setup and highly accurate current measurement modes of operation.] A relatively small capacitance (e.g. 1 $\mu$F) can be used because of the fast to control loop. Because of this highly regulated voltage and reduced decoupling cap value, dielectric absorption effects of decoupling capacitor 422 are minimized, thereby reducing measurement time.

Figure 7A:
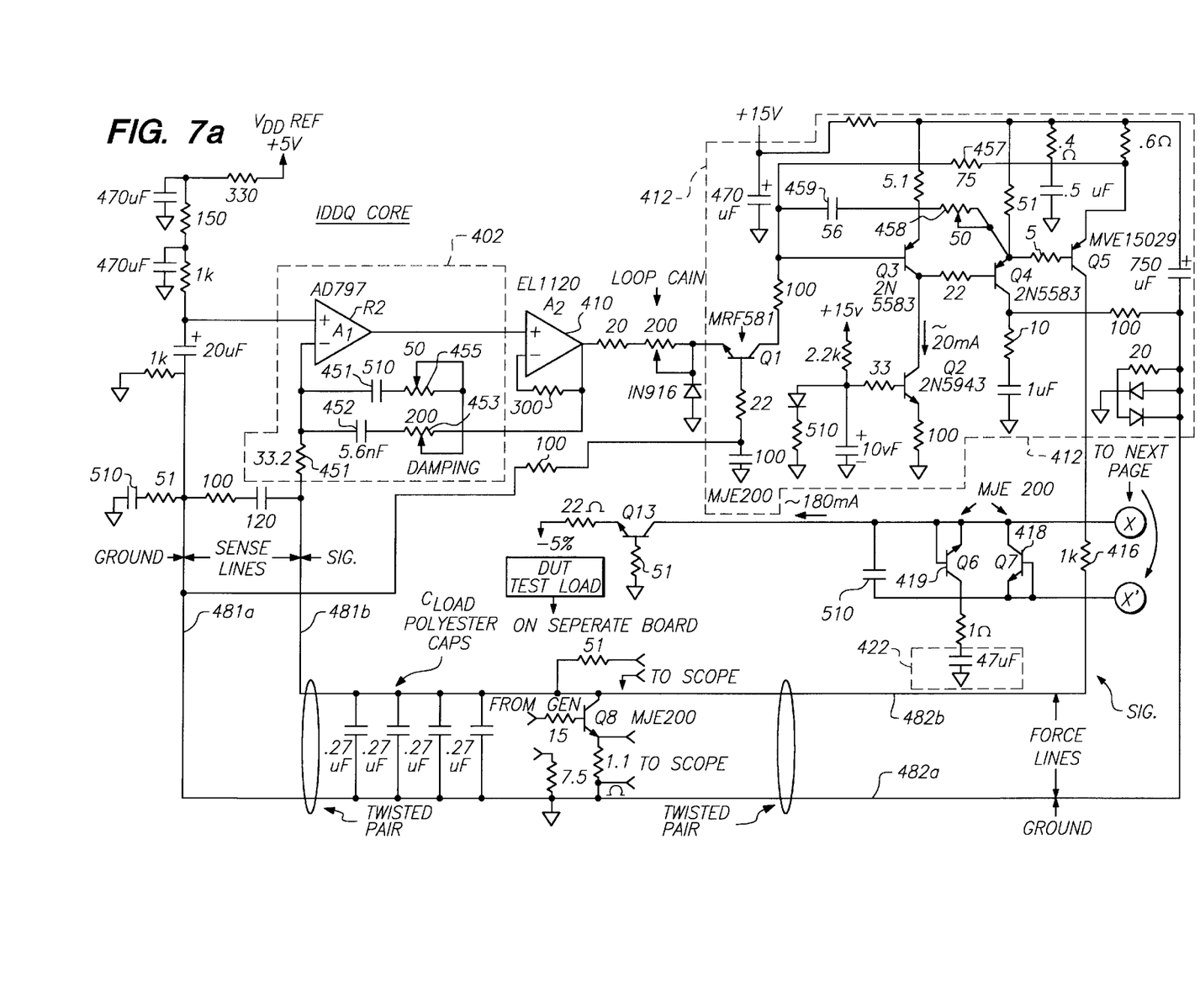
FIGS. 7A–7C depict another embodiment of a power supply according to the invention.
Figure 7B:
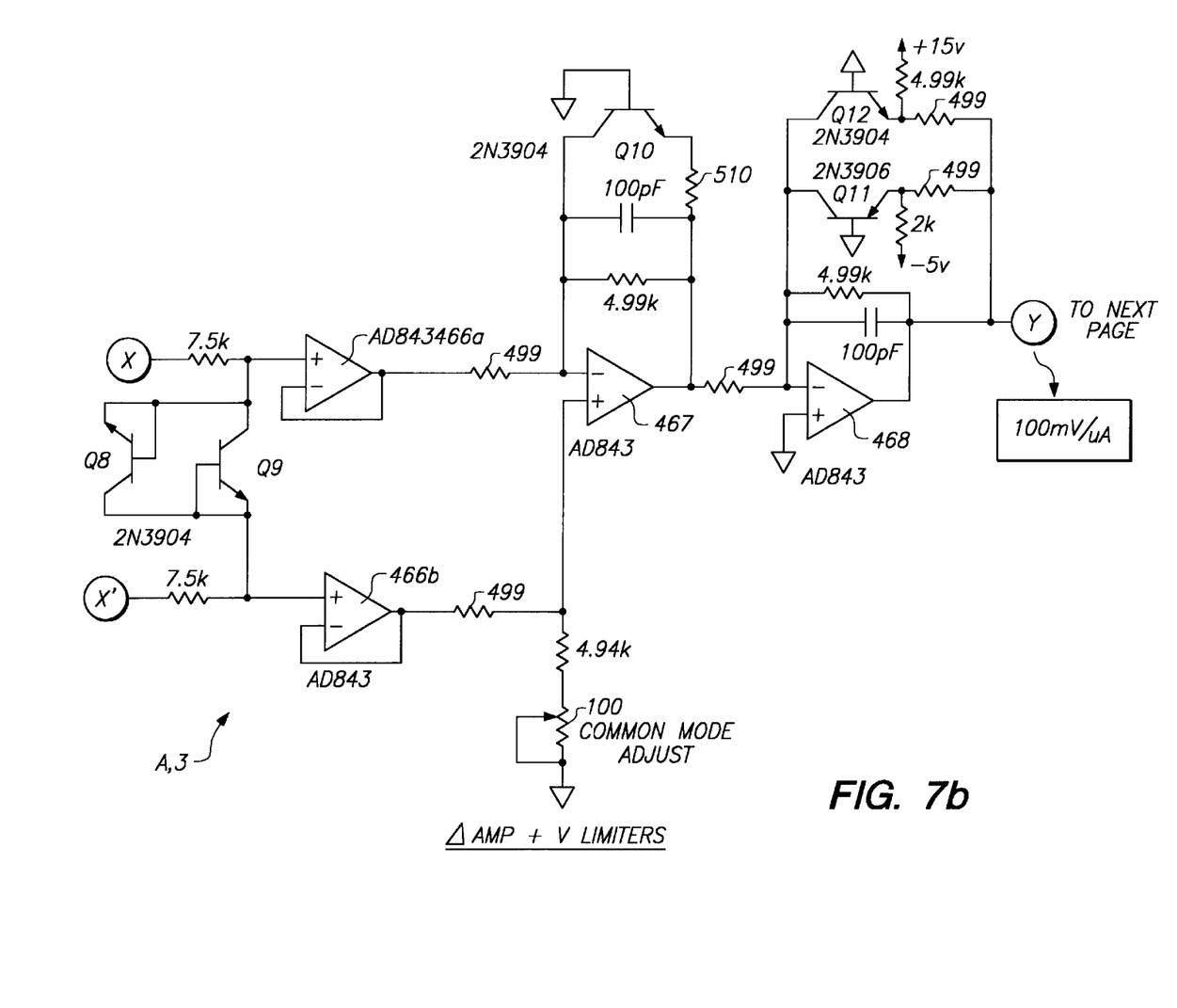
Figure 7C:
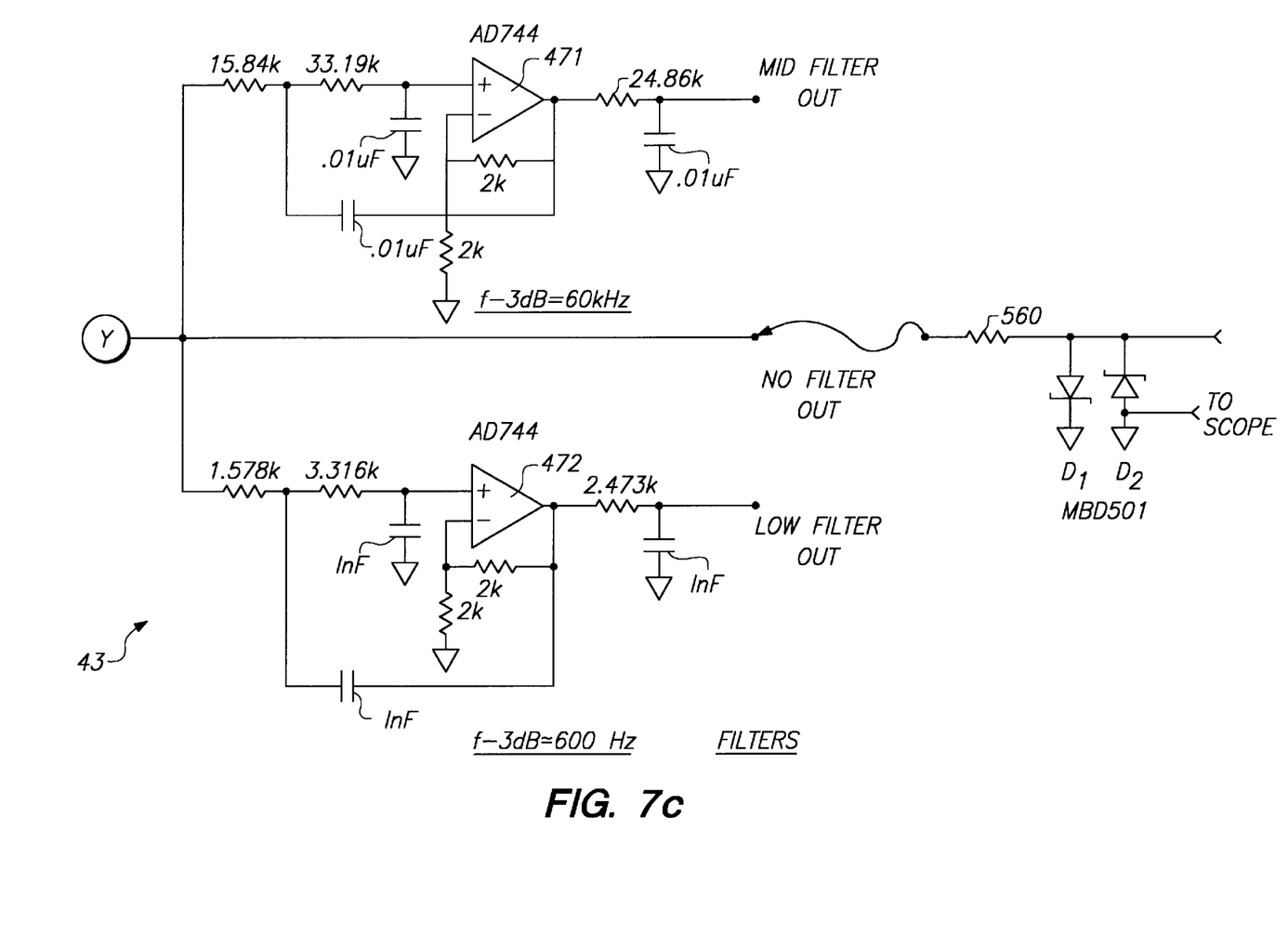

FIGS. 7A–7C are a detailed schematic diagram of another embodiment of the invention, using similar reference numerals. Amplifiers 402 and 410 provide the amplification for the control loop. Amplifier 402 is selected to have very low voltage noise and high speed, for example, an analog devices AD797. Input resistor 408 at the inverting input of amplifier 402 is selected to have a small resistance value to maintain a low noise contribution ((Johnson noise) $V_n = (4kTBR)^{1/2}$), for example, a 33.2 ohm resistor. Resistor 408 and amplifier 402 fix the noise floor of this circuit, which is closely related to the best accuracy current measurement for the overall loop.

Capacitor 452 (e.g., 5.6 nF) and resistor 453 (e.g., 200 ohm) together provide the main compensation network for the control loop formed by amplifiers 402 and 410. Capacitor 454 (e.g., 510 pF) and resistor 455 (e.g., 50 ohm) are used to provide high frequency stability.

Amplifier 410 is a unity gain current feedback buffer, for example, a Elantec EL1120. Amplifier 410 provides a small load to amplifier 402 so that amplifier 402 does not experience thermal settlement transients, while amplifier 410 provides a buffer output signal. Transistors Q1 through Q5, together with their related components, form a voltage controlled current source that serves as current source 412. Feedback from the emitter of transistor Q5 to the base of transistor Q3 improves the bandwidth of current source 412 and increases the output impedance of transistor Q5. Capacitor 459 (e.g., 56 pF) and potentiometer 458 (e.g., 50 ohm) are connected in series between the emitter of transistor Q4 and the base of transistor Q3 to provide compensation in order to prevent instability of the amplifier formed by Q3, Q4 and Q5.

During operation, if the current required from current source 412 is greater than about 0.7 mA, the collector-base junction of transistor Q6 turns on, allowing up to about 1 amp current to be made available. Conversely, when transistor Q6 is off, and thus transistor Q7 is off, a voltage of about 1 mV per 1 $\mu$A appears across resistor 416 (e.g., 1K ohm). This voltage provides an indication of the quiescent current (IDDQ) drawn by the device under test (DUT).

Note that the input and output of this portion of the power supply 400 are differential. Ground sense lines 481A and 481B are AC coupled to the non-inverting input lead of amplifier 402. The ground return path of current source 412 is AC coupled to ground force lines 482A and 482B. By utilizing the separate ground paths, this embodiment provides short settle times for high duty cycle load conditions, rather than requiring a plurality of high current ground paths between the load and the IDDQ circuit. As shown in FIG. 7A, the test load, if located a distance away from this circuitry, is preferably connected via twisted pair lines. These measures reduce magnetic coupling between the force and sense paths and this reduces settle time. Moreover, an advantageous feature of the current driver is that a relatively long cable can be used to connect to the DUT, without sacrificing loop stability or speed.

In FIG. 7A, transistor Q8 emulates a DUT in order to test and/or calibrate the circuit. In actual use, transistor Q8 is either removed or disabled, and the DUT put in its place.

FIG. 7B is a detailed schematic of one embodiment of amplifier 430 of power supply 400. Amplifier 430, in this embodiment, includes non-inverting and inverting input paths provided by amplifiers 466A and 466B, respectively (e.g., analog devices AD843). Additional amplification is provided by amplifiers 467 and 468, for example, also each formed by an AD843 device. As shown, this embodiment of amplifier 430 has a voltage gain of about 100. Transistors Q10 through Q12 are active voltage limiters which give amplifier 430 a short response time by preventing amplifier saturation so that IDDQ measurements can be made shortly after the test vectors are set in the DUT.

FIG. 7C is a schematic diagram of one embodiment of low pass filter 432 of power supply 400. Amplifiers 471 and 472 are the core of three pole Bessel low pass filters, and in one embodiment are provided by analog devices AD744. With values shown in FIG. 7C, amplifier 471 serves as a low frequency filter, having a 3 dB cutoff point of 600 Hz. With values shown in FIG. 7C, amplifier 472 serves as a mid pass filter, with a 3 dB cutoff point of approximately 60 KHz. If desired, a tap can be provided as shown in order to provide an unfiltered output signal. As discussed above, filter 432 serves to remove noise form the output signal of amplifier 430. For a more accurate measurement, more filtering is needed. Thus, the embodiment of FIG. 7C shows three filter output selections, no filtering at all, low pass filtering, and mid level filtering, which can be selected depending on the accuracy desired in a measurement.

Figure 8A:
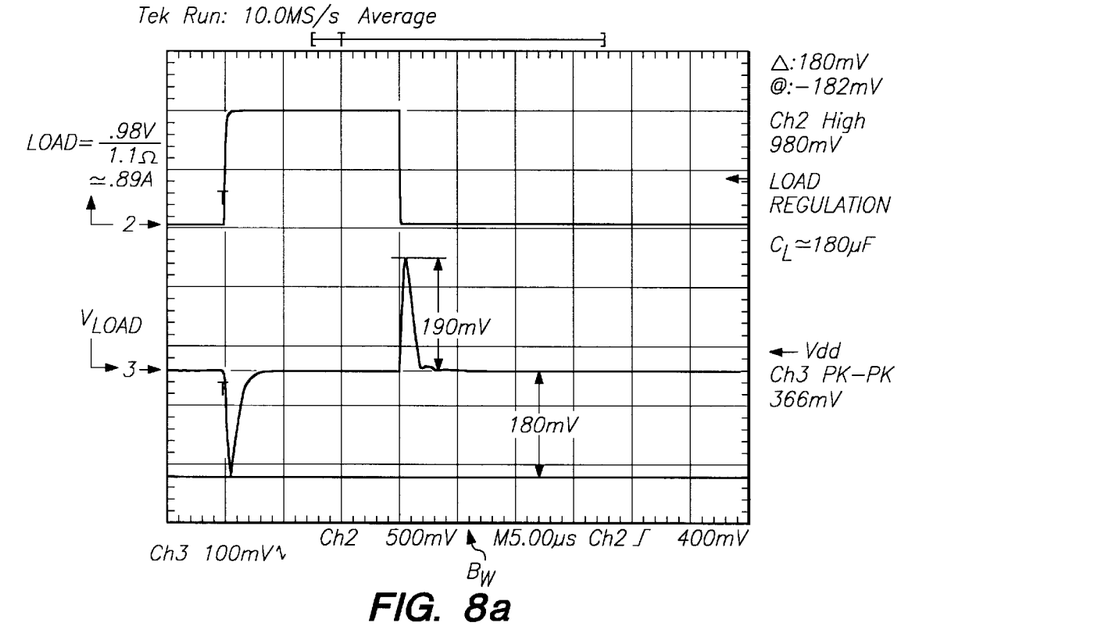
FIGS. 8A–K are graphs showing the output current of the power supply of FIG. 5 with respect to time.

FIGS. 8A through 8K are graphs depicting the operation of the exemplary circuit of FIGS. 7A through 7C. As shown in FIG. 8A, when the load changes less than about 200 mv and $I_{load}$ is approximately 0.89 amps and $C_{load}$ is approximately 1.08 $\mu$F. In this example, the load current pulse width is set sufficiently wide to insure that the circuit settles between load changes.

Figure 8B:
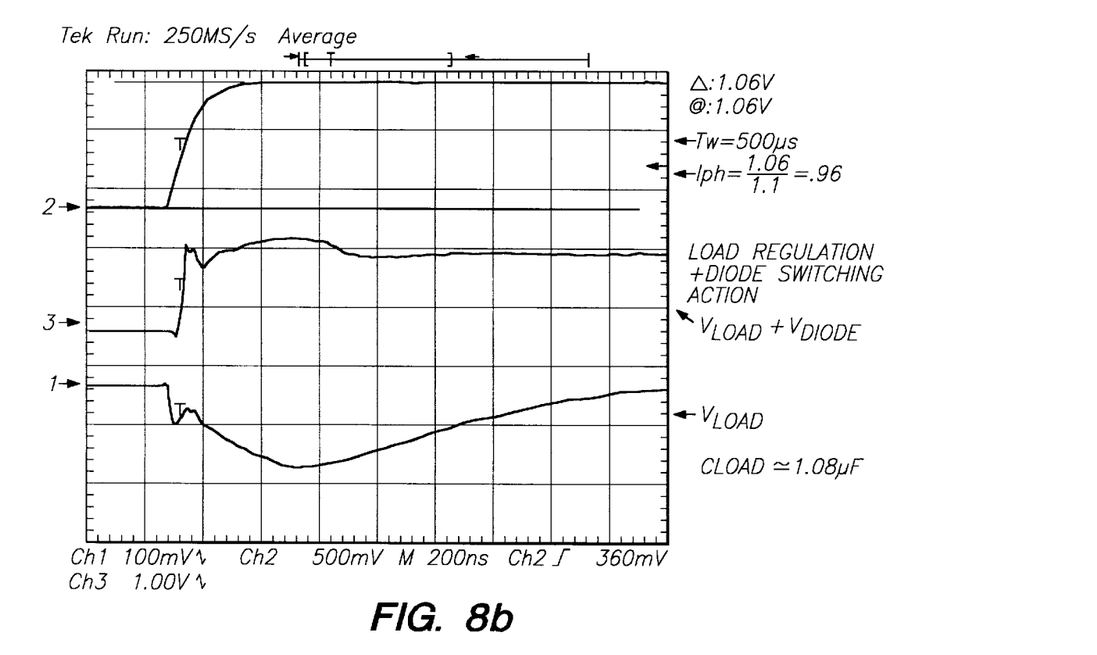

FIG. 8B is a plot depicting what happens after the main clamp diode (the collector-base junction of transistor Q6) turns on. $I_{load}$ ramps up, causing a small step across the load. (the step is from the inductance of the 4 polyester caps). About 100 ns later, Q6 turns on. (Channel 3, collector of Q5, base of Q6). Note that no large change is seen at the load after Q6 turns on. This is because Q6 is driven by a current source, Q5.

Figure 8C:
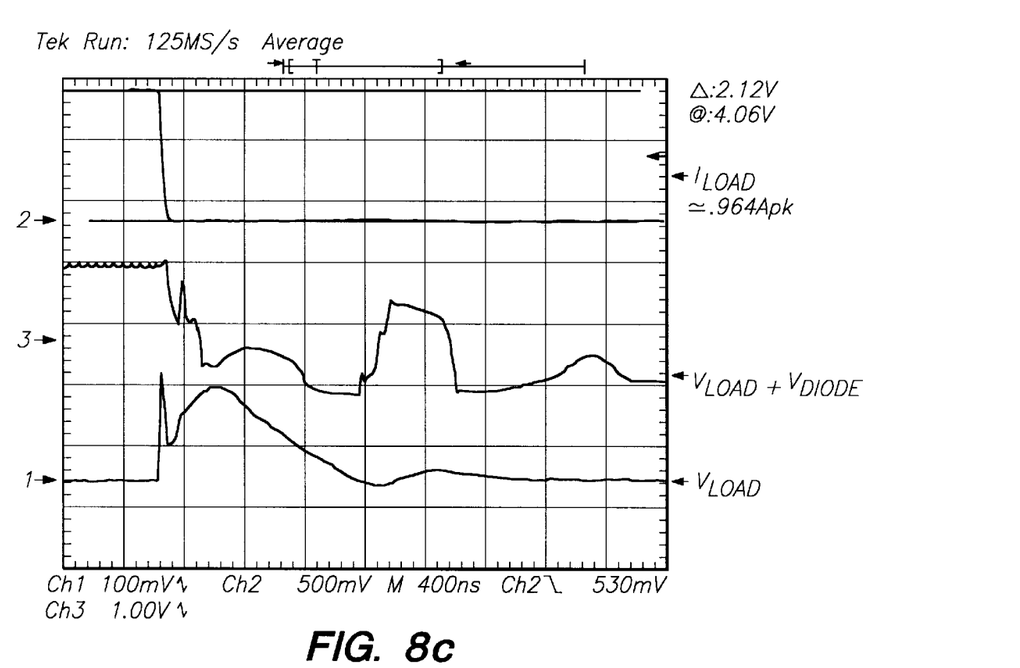

FIG. 8C is a plot showing $V_{load}$ as Q6 turns off. $I_{load}$ ramps to near zero on channel 2. At this time $V_{load}$ spikes up (L of $C_{load}$) until the loop responds. Q6 turns off on channel 3. Note that $V_{load}$ doesn't spike when Q6 turns off. The driver is a current source. The voltage changes at collector of Q5 is a magnified look at the loop settle.

Figure 8D:
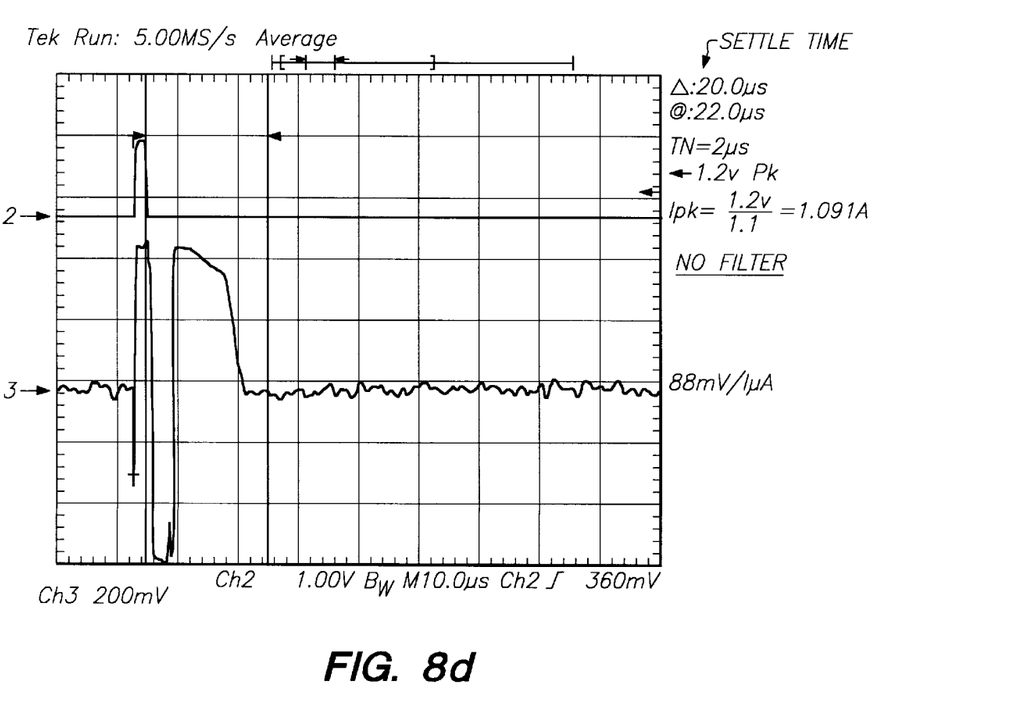
Figure 8E:
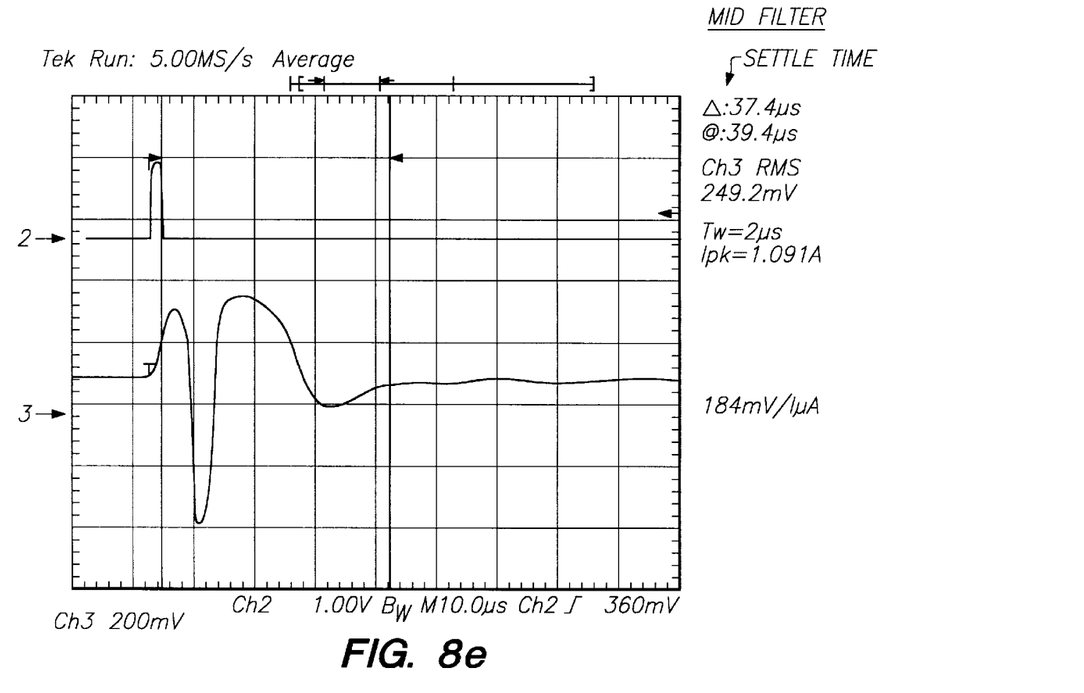
Figure 8F:
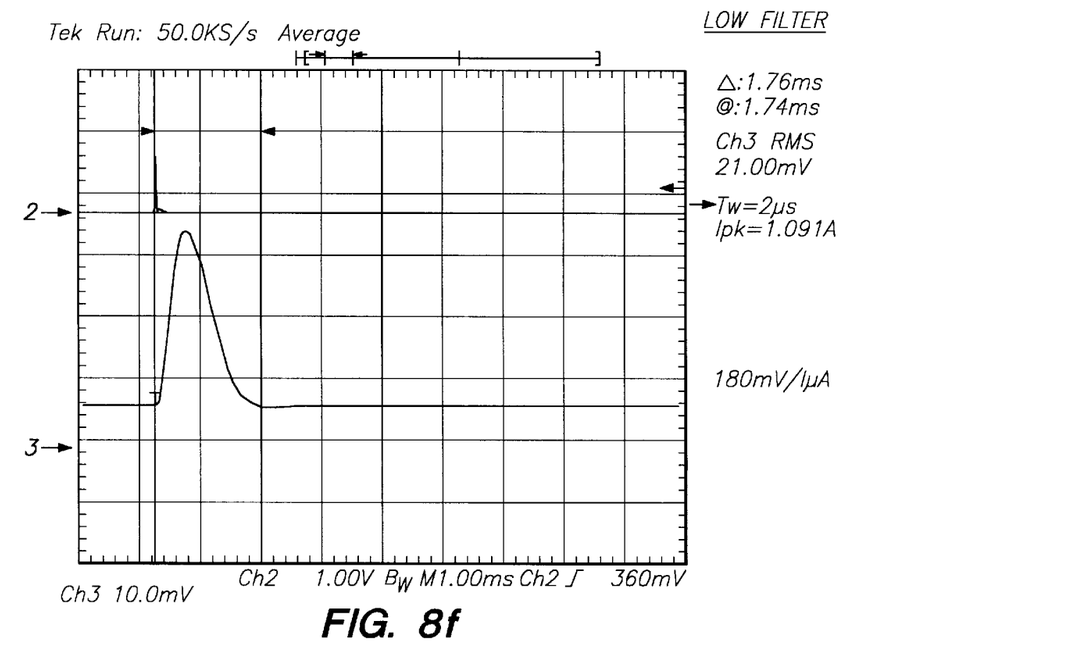

FIGS. 8D, 8E and 8F are plots of an oscilloscope output in averaging mode to show the loop settle in detail. Channel 3 is connected to the differential amp (no filter FIG. 8D) or to the 3 pole bessel filter outputs (mid filter, FIG. 8E and low filter, FIG. 8F). In general the lower the cut-off frequency, the longer the settle time is, with less noise is resulting with the use of the low filter and mid filter.

Figure 8G:
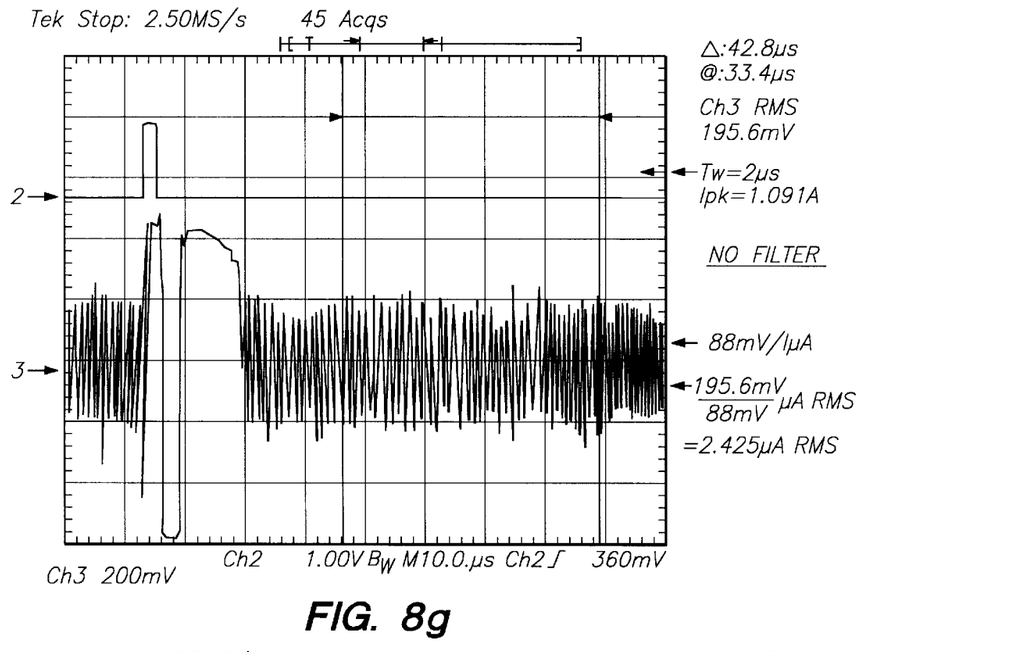
Figure 8H:
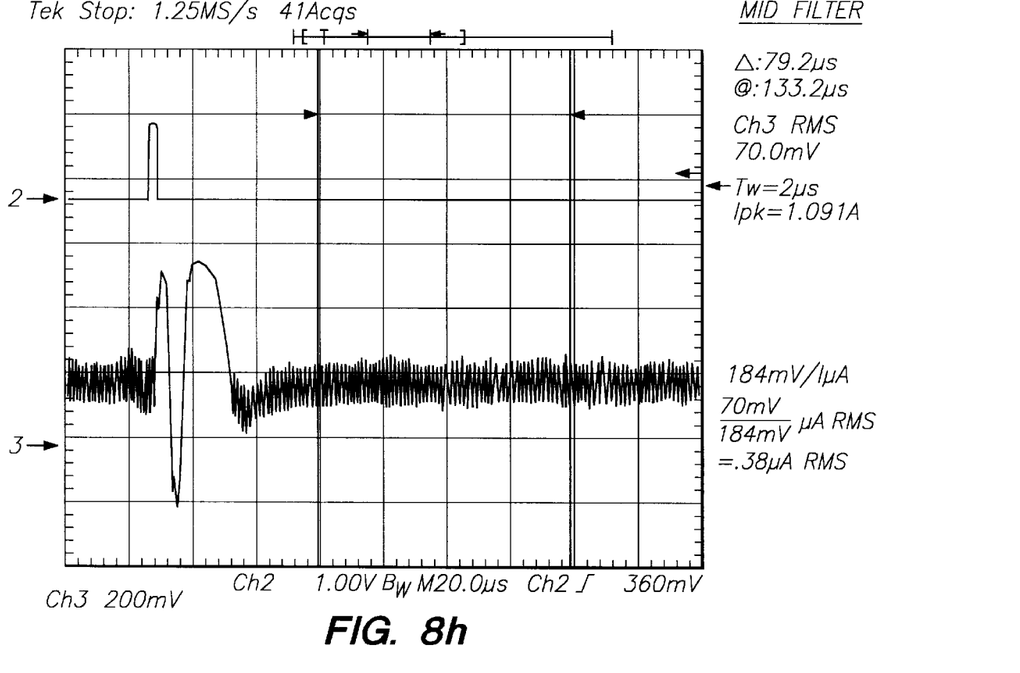
Figure 8I:
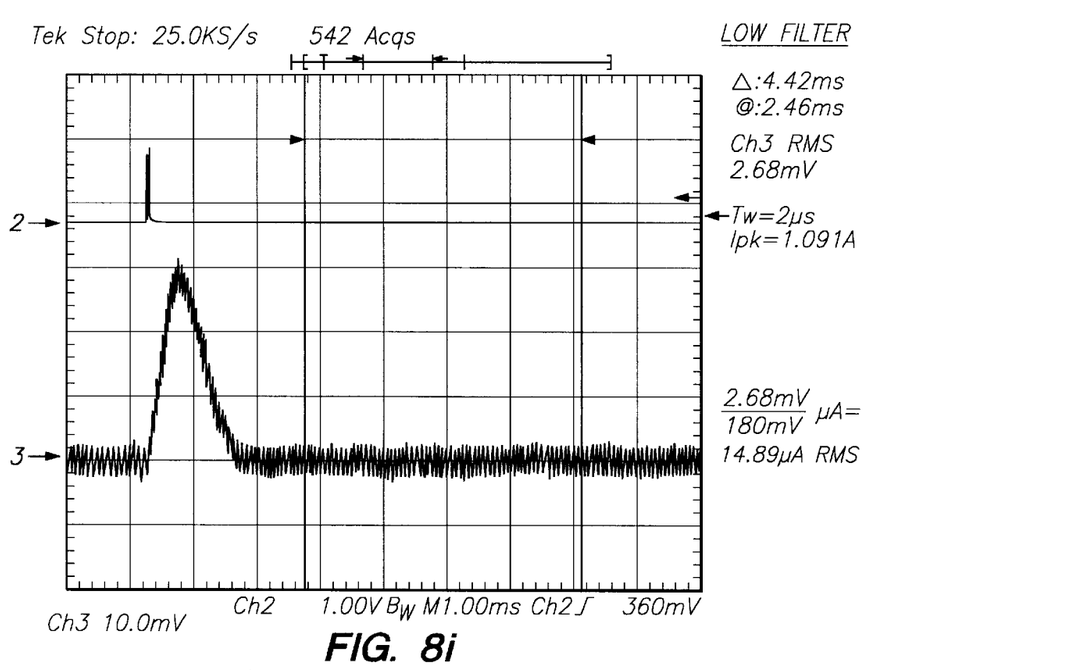

FIGS. 8G, 8H and 8I are oscilloscope plots in persist mode, for one exemplary embodiment. A gated RMS measurement is taken in a period after the loop settles.

| Current noise: | No filter (FIG. 8D): | 2.425 $\mu$A RMS |
| --- | --- | --- |
| | Mid filter (FIG. 8E): | .38 $\mu$A RMS |
| | Low filter (FIG. 8F): | 14.89 nA RMS |

These currents are caused by thermal and shot noise and this limits the measure accuracy at the expense of longer measurement times.

Figure 8J:
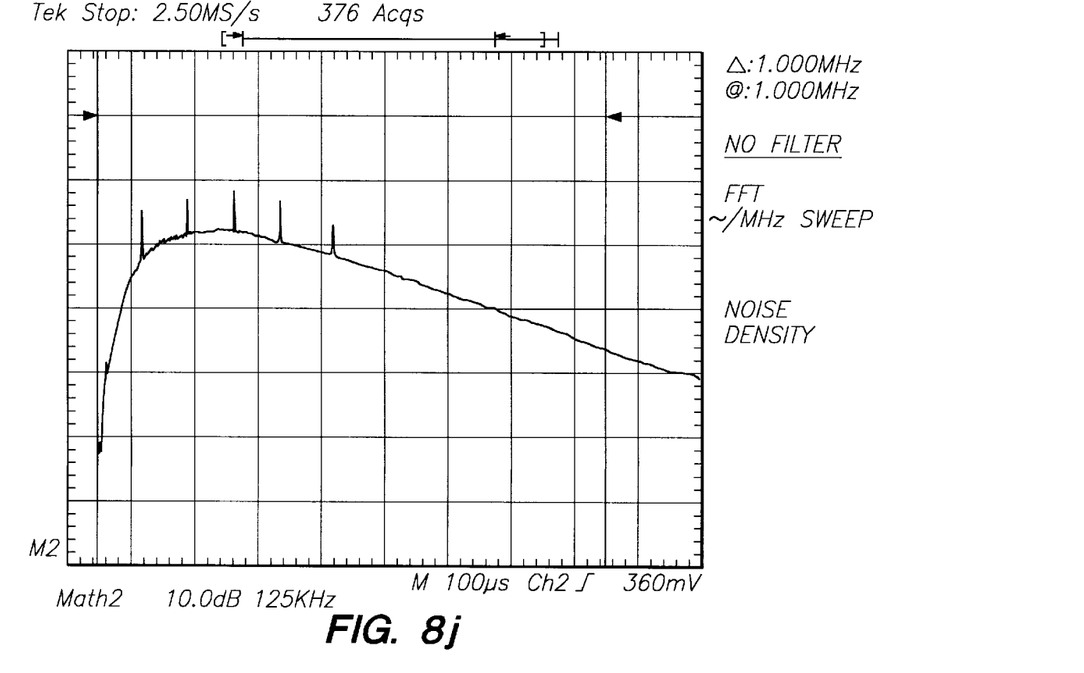
Figure 8K:
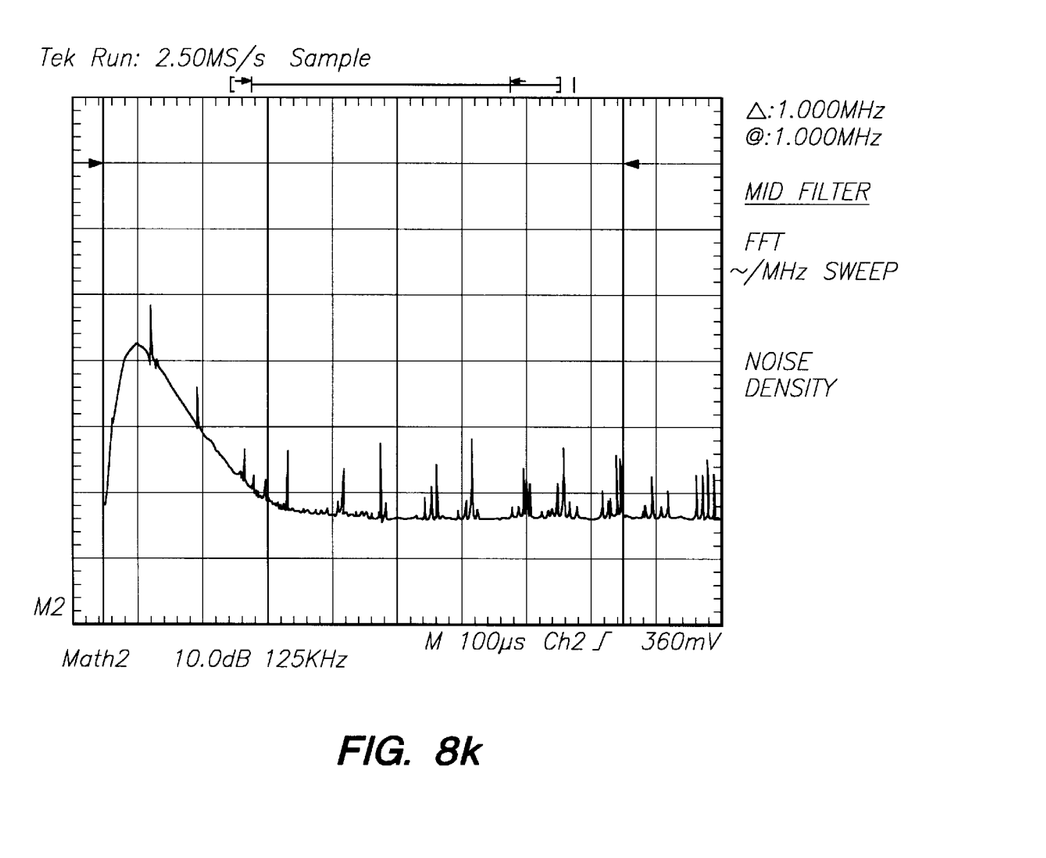

FIGS. 8J and 8K are oscilloscope plots showing noise density. The oscilloscope signals show the average result of a large number (256) of FFTs, with the x axis showing frequency and the y axis showing amplitude. The smooth envelope shows thermal and shot noise density. FIG. 8K shows the action of a three pole bessel low pass filter which has a 3 dB cutoff frequency ($F_c$) approximately equal to 60 KHz.

With reference to FIGS. 8J and 8K, the "spikes" in the plots arise from switching power supplies in our lab, and therefore, the invention using linear power supplies would have smooth plots without the spikes.

All publications, patents and other references mentioned are incorporated herein by reference to the same extent as if each individual publication or patent application was specifically and individually indicated to be incorporated by reference.

ALTERNATIVE EMBODIMENTS

Having disclosed exemplary embodiments and the best mode, modifications and variations may be made to the disclosed embodiments while remaining within the scope of the present invention as defined by the following claims.

What is claimed is:

1. A power supply for testing an integrated circuit, comprising:

a source voltage input terminal;

an operational amplifier coupled to said input terminal and configured to produce current in response to a feedback signal;

a shunt resistor coupled to said operational amplifier;

a diode coupled in parallel with said shunt resistor;

a current sensor coupled in series with said shunt resistor; and an output terminal coupled to said resistor, diode and current sensor, said output terminal configured to connect to a device under test.

2. The power supply of claim 1, further comprising a second operational amplifier positioned between said first operational amplifier and said shunt resistor.

3. The power supply of claim 1, further comprising one end of a decoupling capacitor coupled to said diode between said diode and a device under test, and an other end of said decoupling capacitor coupled to a reference voltage, which may be ground.

4. The power supply of claim 1, further comprising an analog to digital converter coupled to said current sensor and configured to generate a digital signal representative of an analog input signal.

5. A precision measurement power supply, comprising:

a source voltage input terminal;

an operational amplifier coupled to said input terminal and configured to produce current in response to a feedback signal;

a shunt resistor coupled to said operational amplifier;

a diode coupled in parallel with said shunt resistor;

a current sensor coupled in series with said shunt resistor; and an output terminal coupled to said resistor, diode and current sensor, said output terminal configured to connect to a device under test.

6. The power supply of claim 5, further comprising a second operational amplifier positioned between said first operational amplifier and said shunt resistor.

7. The power supply of claim 5, further comprising one end of a decoupling capacitor coupled to said diode between said diode and a device under test, and an other end of said decoupling capacitor coupled to a reference voltage, which may be ground.

8. The power supply of claim 5, further comprising an analog to digital converter coupled to said current sensor and configured to generate a digital signal representative of an analog input signal.

* * * * *